United States Patent
Misumi et al.

(10) Patent No.: US 8,846,544 B2
(45) Date of Patent: Sep. 30, 2014

(54) REVERSE RECOVERY USING OXYGEN-VACANCY DEFECTS

(71) Applicant: Toyota Jidosha Kabushiki Kaisha, Toyota (JP)

(72) Inventors: Tadashi Misumi, Nisshin (JP); Shinya Iwasaki, Toyota (JP); Takahide Sugiyama, Aichi-ken (JP)

(73) Assignee: Toyota Jidosha Kabushiki Kaisha, Toyota-Shi (JP)

( * ) Notice: Subject to any disclaimer, the term of this patent is extended or adjusted under 35 U.S.C. 154(b) by 0 days.

(21) Appl. No.: 14/193,434

(22) Filed: Feb. 28, 2014

(65) Prior Publication Data

US 2014/0179116 A1     Jun. 26, 2014

Related U.S. Application Data

(62) Division of application No. 12/967,373, filed on Dec. 14, 2010, now Pat. No. 8,698,285.

(30) Foreign Application Priority Data

Dec. 16, 2009   (JP) .................................. 2009-285078
Jul. 28, 2010   (JP) .................................. 2010-169360

(51) Int. Cl.
*H01L 21/31*     (2006.01)
*H01L 21/469*     (2006.01)
*H01L 21/02*     (2006.01)

(52) U.S. Cl.
CPC ......... *H01L 21/02238* (2013.01); *Y10S 438/92* (2013.01)
USPC .................... 438/770; 438/920; 257/E29.336

(58) Field of Classification Search
USPC .................................. 257/E29.336; 438/920
See application file for complete search history.

(56) References Cited

U.S. PATENT DOCUMENTS

| | | |
|---|---|---|
| 2003/0062584 A1 | 4/2003 | Takahashi |
| 2006/0281263 A1 | 12/2006 | Yamazaki et al. |
| 2008/0023795 A1 | 1/2008 | Yamazaki et al. |

FOREIGN PATENT DOCUMENTS

| | | |
|---|---|---|
| JP | 06-035010 A | 2/1994 |
| JP | 07-106605 A | 4/1995 |
| JP | 11-097376 A | 4/1999 |
| JP | 2004-088012 A | 3/2004 |
| JP | 2006-352101 A | 12/2006 |
| JP | 2007-251003 A | 9/2007 |
| JP | 2007-266103 A | 10/2007 |
| JP | 2008-177296 A | 7/2008 |
| JP | 2010-161237 A | 7/2010 |
| WO | 99/09600 A1 | 2/1999 |

OTHER PUBLICATIONS

Office Action mailed May 8, 2012 in Japanese Application No. 2010-169360 and English translation thereof.

*Primary Examiner* — Daniel Luke
(74) *Attorney, Agent, or Firm* — Kenyon & Kenyon LLP

(57) ABSTRACT

A semiconductor device comprises a semiconductor substrate, a first electrode formed on a first main surface of the semiconductor substrate, and a second electrode formed on a second main surface of the semiconductor substrate. The semiconductor substrate includes a first region in which a density of oxygen-vacancy defects is greater than a density of vacancy cluster defects, and a second region in which the density of vacancy cluster defects is greater than the density of oxygen-vacancy defects.

3 Claims, 13 Drawing Sheets

REVERSE RECOVERY USING OXYGEN-VACANCY DEFECTS

CROSS-REFERENCE TO RELATED APPLICATIONS

This is a divisional application based on U.S. patent application Ser. No. 12/967,373, filed on Dec. 14, 2010, and claims priority to Japanese Patent Application No. 2009-285078 filed on Dec. 16, 2009 and Japanese Patent Application No. 2010-169360 filed on Jul. 28, 2010, the contents of which are hereby entirely incorporated by reference into the present application.

TECHNICAL FIELD

The present invention relates to a semiconductor device. The present invention, in particular, relates to a free wheel diode which is connected to a power semiconductor device in an inverse-parallel connection.

DESCRIPTION OF RELATED ART

A diode is used in many types of electrical circuits, and its function covers widespread fields. For example, the diode is used in an inverter circuit which controls a supply of an electrical power to a load. The inverter circuit comprises a plurality of power semiconductor devices being in bride connection, and diodes are connected to these power semiconductor devices in an inverse-parallel connection respectively. This type of diode is referred to as a Free Wheel Diode (hereinafter referred to as "FWD"). The FWD communicates a load current when the power semiconductor device performs an on-off control of the load current.

In recent years, the inverter circuit for controlling a motor disposed in a hybrid car or an electric car is required to have a low switching loss and a high surge breakdown voltage. In order to meet these requirements, a reverse recovery property of the FWD needs to be improved. In particular, efforts of lowering of a reverse recovery charge (Qrr) for the low switching loss and softening of a recovery current which contributes in the high surge breakdown voltage have been made by forming crystal defects within the semiconductor substrate.

WO 99/09600 A, JP H06-35010 A and JP 2004-88012 A disclose a technique for improving the reverse recovery property of the FWD. In the aforementioned prior art, the reverse recovery property of the FWD is improved by combining two types of crystal defects within the semiconductor substrate: one type of crystal defects is formed by using a diffusion of a heavy metal, and another type of crystal defects is formed by using an irradiation of charged particles.

SUMMARY

In general, an energy level of the crystal defects is a recombination center for electrons and holes, and also a generation center for electrons and holes when a high electrical field is applied (a reverse biased state). Therefore, if many crystal defects are formed within the semiconductor substrate, an increase of leak current may occur under the reverse biased state. It is known that crystal defects formed by using the diffusion of the heavy metal have a low generation degree of electrons and holes (the generation degree of electrons and holes hereinafter referred to as "a generation probability"). Therefore, the leak current is repressed in the case where the type of crystal defects formed within the semiconductor substrate is originated from the diffusion of the heavy metal. However, the crystal defects formed by using the diffusion of the heavy metal has a problem that a recombination degree of electrons and holes (hereinafter referred to as "a recombination probability") easily varies based on a temperature. On the other hand, the crystal defects formed by using the irradiation of charged particles is characterized in that the recombination probability of electrons and holes does not vary based on the temperature. In the above mentioned prior art, both types of crystal defects formed by using the diffusion of the heavy metal and irradiation of the charged particle are combined within the semiconductor substrate, therefore, it results in the lowering of the reverse recovery charge (Qrr) and the softening of the recovery current while repressing the increase of the leak current.

However, in the above mentioned prior art, the crystal defects are formed by using the heavy metal (e.g. platinum). The process for doping the heavy metal into the semiconductor substrate needs special equipments for preventing a pollution of the heavy metal. Such special equipments are different from general semiconductor manufacturing equipments. Therefore, a use of the heavy metal severely raises a cost of a manufacturing of the semiconductor device.

The technique disclosed in the present specification may provide a semiconductor device in which different types of crystal defects are combined without the use of the heavy metal.

Inventors of the present teachings focused on the energy level of the crystal defects. The crystal defects formed by using the diffusion of the heavy metal have the energy level of the recombination center at a level 0.23 eV lower from a conductance band energy edge (Ec). On the other hand, the crystal defects formed by using the irradiation of charged particles are vacancy cluster defects which a plurality of atomic vacancies is combined, and have the energy level of the recombination center at 0.40 eV lower from the conductance band energy edge (Ec). In comparison, crystal defects formed by using the diffusion of the heavy metal have a shallow energy level, and crystal defects formed by using the irradiation of charged particles have a deep energy level.

As a result of a research by the inventors of the present teachings, it was found that the recombination probability and the generation probability of electrons and holes depend on the energy level of crystal defects. FIG. 1 shows a relationship between the energy level of crystal defects and the recombination probability in the case of a single trap, and also shows a relationship between the energy level of crystal defects and the generation probability in the case of the single trap. As shown in FIG. 1, the generation probability of electrons and holes at the shallow energy level of crystal defects (e.g. crystal defects formed by using the diffusion of the heavy metal) is low, therefore, the leak current can be repressed. However, the recombination probability of electrons and holes at the shallow energy level of crystal defects varies based on the temperature. On the other hand, the recombination probability of electrons and holes at the deep energy level of crystal defects (e.g. the crystal defects formed by using the irradiation of charged particles) does not vary based on the temperature. Hence, it comes to appear that the recombination probability and the generation probability of electrons and holes depend on the energy level of crystal defects. Therefore, it is expected that the semiconductor device in which different types of crystal defects are combined without the use of the heavy metal may be realized if crystal defects having the energy level as shallow as crystal defects formed by using the heavy metal are formed.

A semiconductor device disclosed in the present specification may comprise a semiconductor substrate, a first electrode formed on a first main surface of the semiconductor substrate, and a second electrode formed on a second main surface of the semiconductor substrate. The semiconductor substrate may include a first region in which a density of oxygen-vacancy defects is greater than a density of vacancy cluster defects, and a second region in which the density of vacancy cluster defects is greater than the density of oxygen-vacancy defects. The semiconductor device disclosed in the present specification is characterized in that oxygen-vacancy defects are formed therein. The oxygen-vacancy defects have the energy level at about 0.17 eV lower from the conductance band energy edge (Ec), and its energy level is almost identical with the energy level of crystal defects formed by using the diffusion of the heavy metal. Therefore, oxygen-vacancy defects may alter crystal defects formed by using the diffusion of the heavy metal. If oxygen-vacancy defects are formed, a semiconductor device in which different types of crystal defects are combined is realized without the use of the heavy metal.

DETAILED DESCRIPTION OF INVENTION

Figure 2:
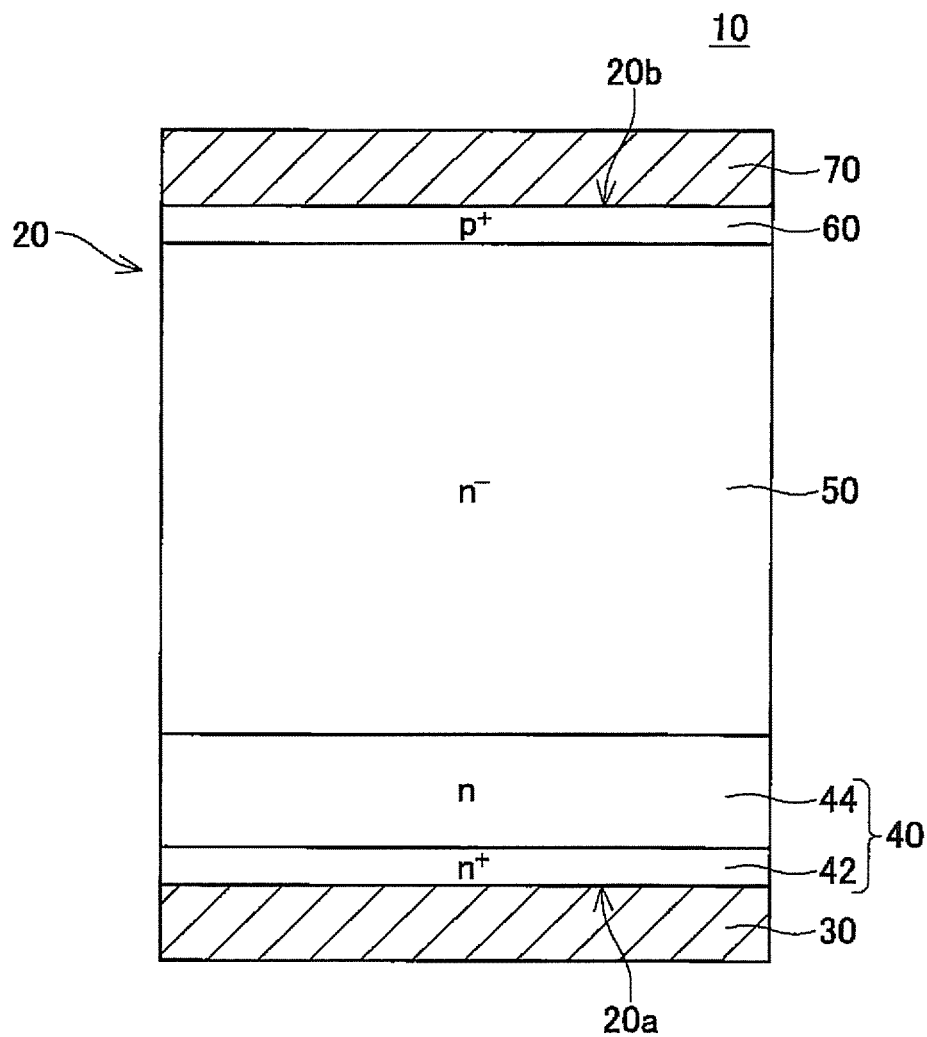
FIG. 2 shows a schematic cross sectional view of an essential part of a diode in an embodiment.

FIG. 2 shows a schematic cross sectional view of a diode 10. Note that FIG. 2 only depicts an element region and does not depict a terminal region disposed around the element region. The diode 10 comprises a semiconductor substrate 20 of monocrystal silicon, a cathode electrode 30 formed on a first main surface 20a of the semiconductor substrate 20 and an anode electrode 70 formed on a second main surface 20b of the semiconductor substrate 20. The diode 10 belongs to a so-called vertical type PIN diode.

As shown in FIG. 2, the semiconductor substrate 20 comprises a cathode region 42, an electrical field inhibition region 44 formed on the cathode region 42, a voltage maintaining region 50 formed on the electrical field inhibition region 44 and an anode region 60 formed on the voltage maintaining region 50. The cathode region 42 and the electrical field inhibition region 44 include a higher density of n-type impurities than the voltage maintaining region 50. The cathode region 42 and the electrical field inhibition region 44 may be referred to as an n-type impurity introducing region 40. The cathode region 42 is in contact with the cathode electrode 30. The voltage maintaining region 50 isolates the n-type impurity introducing region 40 and the anode region 60. The voltage maintaining region 50 includes a lower density of n-type impurities. The anode region 60 includes a higher density of p-type impurities and be in contact with the anode electrode 70.

Figure 3:
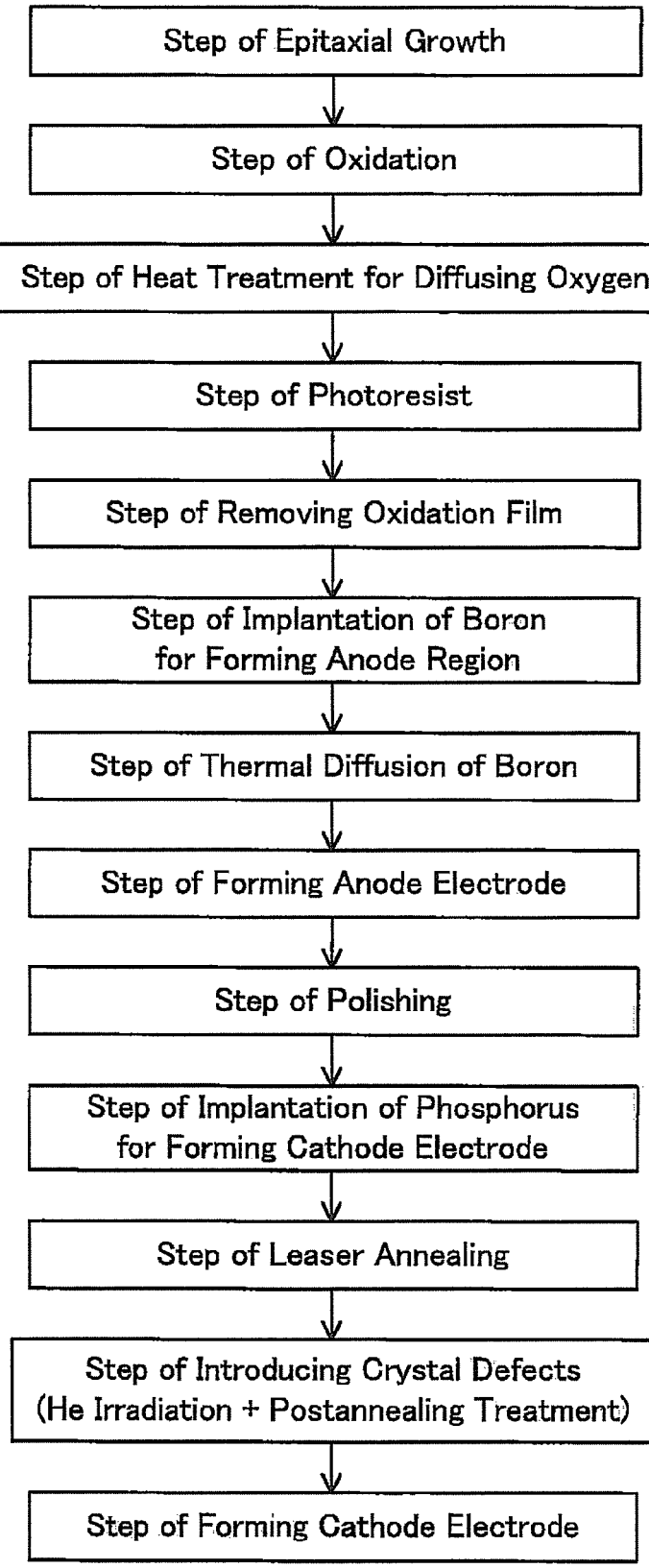
FIG. 3 shows a schematic overview of a manufacturing method of the diode in the embodiment.
Figure 4:
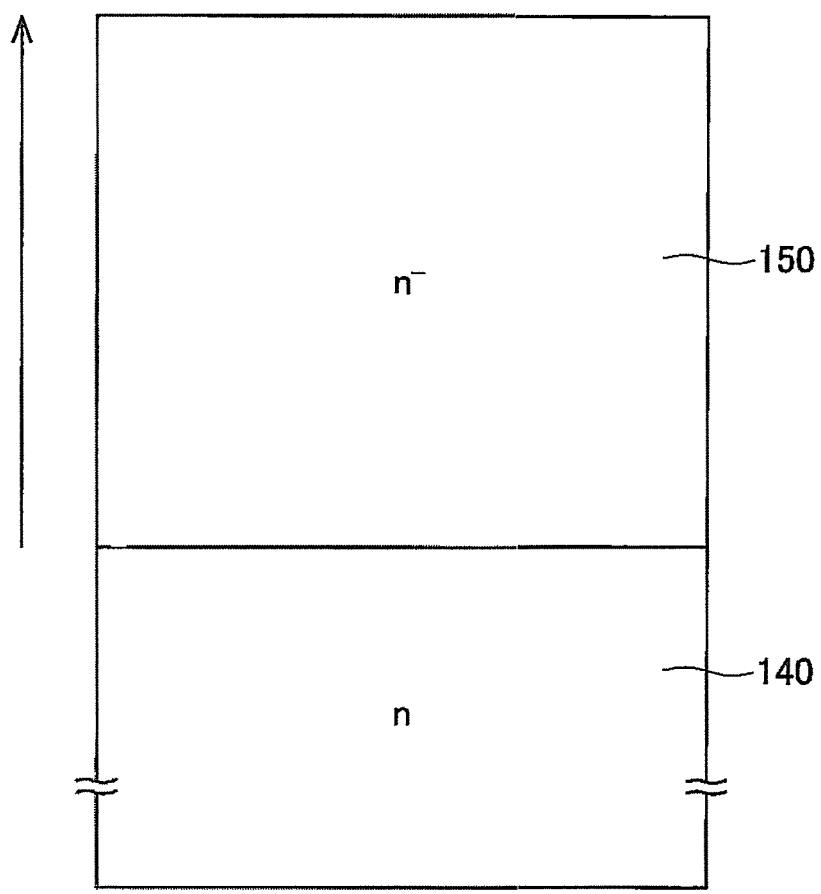
FIG. 4 shows a first step of the manufacturing method of the diode in the embodiment.

Next, a manufacturing method of the diode 10 will be explained referring to a flow shown in FIG. 3. First, as shown in FIG. 4, an n-type base substrate 140 (which later becomes the n-type impurity introducing region 40) is prepared. In one embodiment, the impurity density of the base substrate 140 is about $1\times10^{15}$ cm$^{-3}$. Next, an n$^-$-type epitaxial layer 150 (which later becomes the voltage maintaining region 50 and the anode region 60) is grown on the base substrate 140 by using the technique of the epitaxial growth. In one embodiment, the thickness of the epitaxial layer 150 is about 100 μm and its impurity density is about $1\times10^{14}$ cm$^3$.

Figure 5:
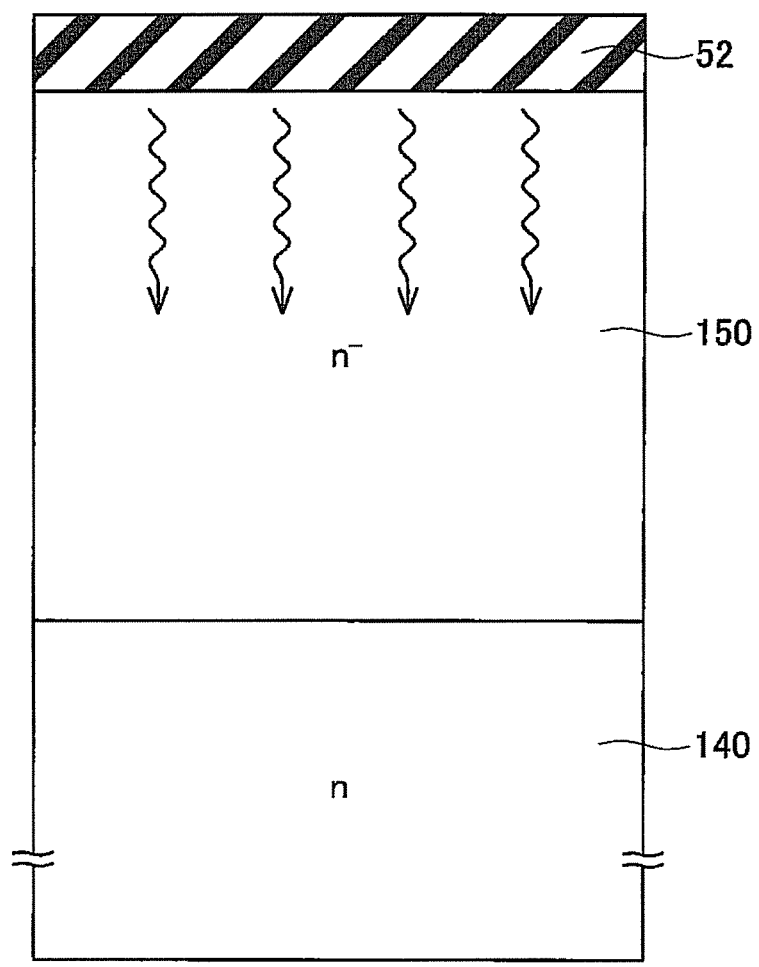
FIG. 5 shows a second step of the manufacturing method of the diode in the embodiment.

Next, as shown in FIG. 5, a silicon oxide film 52 is formed on the epitaxial layer 150 under an oxygen atmosphere by using the technique of the thermal oxidation. In this thermal oxidation step, it is preferable that an atmosphere temperature is set between 1100-1200 degrees Celsius (° C.), and a thermal oxidation time is set between 10-500 minutes. In this thermal oxidation step with the above condition, oxygen is introduced into a surface portion of the epitaxial layer 150 up to its solid solubility limit concentration. Next, oxygen introduced into the surface portion of the epitaxial layer 150 are diffused toward a deep portion of the epitaxial layer 150 under an inert gas atmosphere by using the technique of the heat treatment. In this heat treatment step, it is preferable that an atmosphere temperature is set more than 1150 degrees Celsius. In this heat treatment step with the above condition, oxygen can be diffused to a deeper location at least than a range location of helium in a helium irradiation step which will be described hereinafter. Specifically, it is preferable that a target value of an oxygen density introduced within the epitaxial layer 150 is more than $1\times10^{17}$ cm$^{-3}$ at 10 μm depth, more preferable more than $1\times10^{17}$ cm$^{-3}$ at 20 μm depth.

Figure 6:
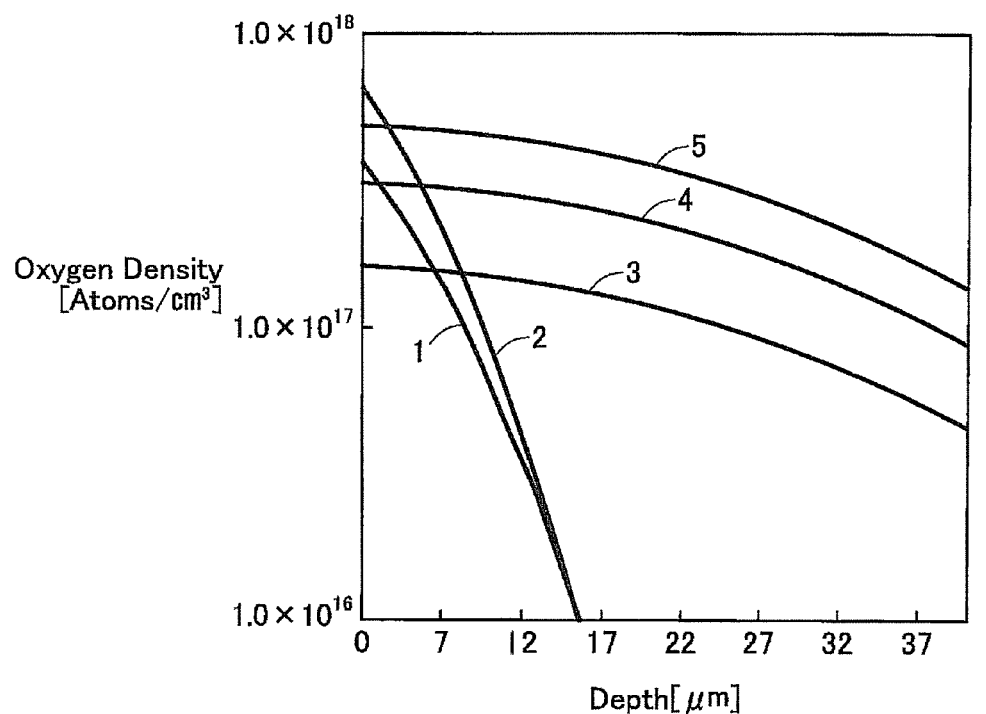
FIG. 6 shows a calculated value of an oxygen density introduced within an epitaxial layer.
Figure 7:
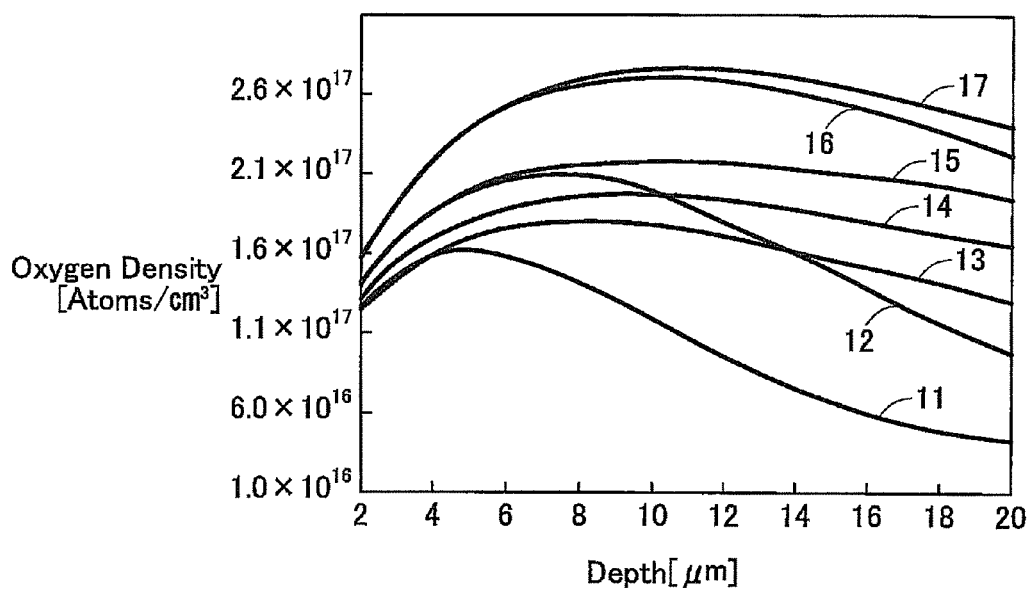
FIG. 7 shows a measured value of the oxygen density introduced within the epitaxial layer.

FIG. 6 shows a calculated value of the oxygen density introduced within the epitaxial layer 150 by the thermal oxidation step and the heat treatment step. The FIG. 7 shows a measured value of the oxygen density introduced within the epitaxial layer 150 by the thermal oxidation step and the heat treatment step. A vertical axis indicates the oxygen density and a horizontal axis indicates a depth from the surface of the epitaxial layer 150.

In FIG. 6, calculated values 1 and 2 show expected results in the case where only the thermal oxidation step is performed. In the thermal oxidation step of the calculated value 1, the atmosphere temperature is set at 1100 degrees Celsius and the thermal oxidation time is set at 49 minutes. In the thermal oxidation step of the calculated value 2, the atmosphere temperature is set at 1200 degrees Celsius and the thermal oxidation time is set at 10 minutes. Calculated values 3 to 5 show expected results in the case where both of the thermal oxidation step and the heat treatment step are performed. In the thermal oxidation step of the calculated value 3, the atmosphere temperature is set at 1100 degrees Celsius and the thermal oxidation time is set at 49 minutes. In the thermal oxidation step of the calculated value 4, the atmosphere temperature is set at 1150 degrees Celsius and the thermal oxidation time is set at 180 minutes. In the thermal oxidation step of the calculated value 5, the atmosphere temperature is set at 1150 degrees Celsius and the thermal oxidation time is set at 440 minutes. In the heat treatment step of calculated values 3 to 5, the atmosphere temperature is set at 1150 degrees Celsius and the heat treatment time is set at 328 minutes.

As shown in FIG. 6, all calculated values 1 to 5 indicate that the oxygen can be introduced within the epitaxial layer 150 over the target value. In particular, the calculated values 3 to 5 for which both of the thermal oxidation step and the heat treatment step were performed indicate that oxygen can be introduced over the target value even at a deeper portion of the epitaxial layer 150. Comparing the calculated value 1 with the calculated value 2, it indicates that the oxygen densities respectively introduced by the thermal oxidation step are almost the same therebetween.

Next, the calculated values of FIG. 6 are verified by the measured values of FIG. 7. In FIG. 7, measured values 11 and 12 show results in the case where only the thermal oxidation step is performed. In the thermal oxidation step of the measured value 11, the atmosphere temperature is set at 1100 degrees Celsius and the thermal oxidation time is set at 49 minutes. In the thermal oxidation step of the measured value 12, the atmosphere temperature is set at 1150 degrees Celsius and the thermal oxidation time is set at 49 minutes. Measured values 13 to 15 show results in the case where both of the thermal oxidation step and the heat treatment step are performed. In the thermal oxidation step of the measured value 13, the atmosphere temperature is set at 1100 degrees Celsius and the thermal oxidation time is set at 49 minutes. In the thermal oxidation step of the measured value 14, the atmosphere temperature is set at 1150 degrees Celsius and the thermal oxidation time is set at 180 minutes. In the thermal oxidation step of the measured value 15, the atmosphere temperature is set at 1150 degrees Celsius and the thermal oxidation time is set at 440 minutes. In the heat treatment step of measured values 13 to 15, the atmosphere temperature is set at 1150 degrees Celsius and the heat treatment time is set at 328 minutes (nitrogen is used as an inert gas). Further, in FIG. 7, some examples which the thermal oxidation time in the thermal oxidation step is longer are verified for the reference. Measured values 16 and 17 show results in the case where only the thermal oxidation step with the longer thermal oxidation time is performed. In the thermal oxidation step of the measured value 16, the atmosphere temperature is set at 1150 degrees Celsius and the thermal oxidation time is set at 440 minutes. In the thermal oxidation step of the measured value 17, the atmosphere temperature is set at 1150 degrees Celsius and the thermal oxidation time is set at 615 minutes.

In the thermal oxidation step of the measured values 11 to 14, a pyrogenic oxidation with oxide gas and hydrogen gas is used. In the thermal oxidation step of the measured values 15 and 16, a dry oxidation with oxide gas and hydrogen gas is used. In the thermal oxidation step of the measured value 17, a nitrogen dilution dry oxidation with oxide gas and diluted nitrogen gas is used. The oxygen density of the silicon oxide film 52 will differ based on the difference of these oxidation methods. However, since every oxygen densities of the silicon oxide films 52 are higher than the solid solubility limit of the epitaxial layer 150, it is supposed that difference of these oxidation methods does not affect the oxygen density introduced within the epitaxial layer 150.

As shown in FIG. 7, it is verified that these results are almost the same as the expected calculated values in FIG. 6. It is verified that the method for performing the thermal oxidation step and the heat treatment step are useful in introducing oxygen with higher density into the epitaxial layer 150. Further, in comparing the measured values 13 to 15 with the measured values 11, 12, 16 and 17, it is verified that the method for combining the thermal oxidation step and the heat treatment step can help to introduce oxygen such that the gradient of the oxygen density along the thickness direction is gradual and oxygen can be introduced to deeper portion.

Although conditions in the above the thermal oxidation step and the heat treatment step are not limited to above-mentioned conditions, it is preferable that the oxygen density of an entire areas in the epitaxial layer 150 and the base substrate 140 in the thickness direction rises after the thermal oxidation step and the heat treatment step. It is more preferable that oxygen distributes such that the oxygen density is constant within the epitaxial layer 150 and the base substrate 140 after the thermal oxidation step and the heat treatment step. As mentioned above, when oxygen is introduced from the silicon oxide film 52, a peak of the oxygen density does not appear within the epitaxial layer 150 and the base substrate 140. In one embodiment, it is preferable that the oxygen density within the epitaxial layer 150 and the base substrate 140 is adjusted between $1\times10^{17}$ cm$^{-3}$ and $3\times10^{17}$ cm$^{-3}$. Note that, in one embodiment, oxygen ions may be introduced within the epitaxial layer 150 and the base substrate 140 by using the ion irradiation technique before the heat treatment step.

Figure 8:
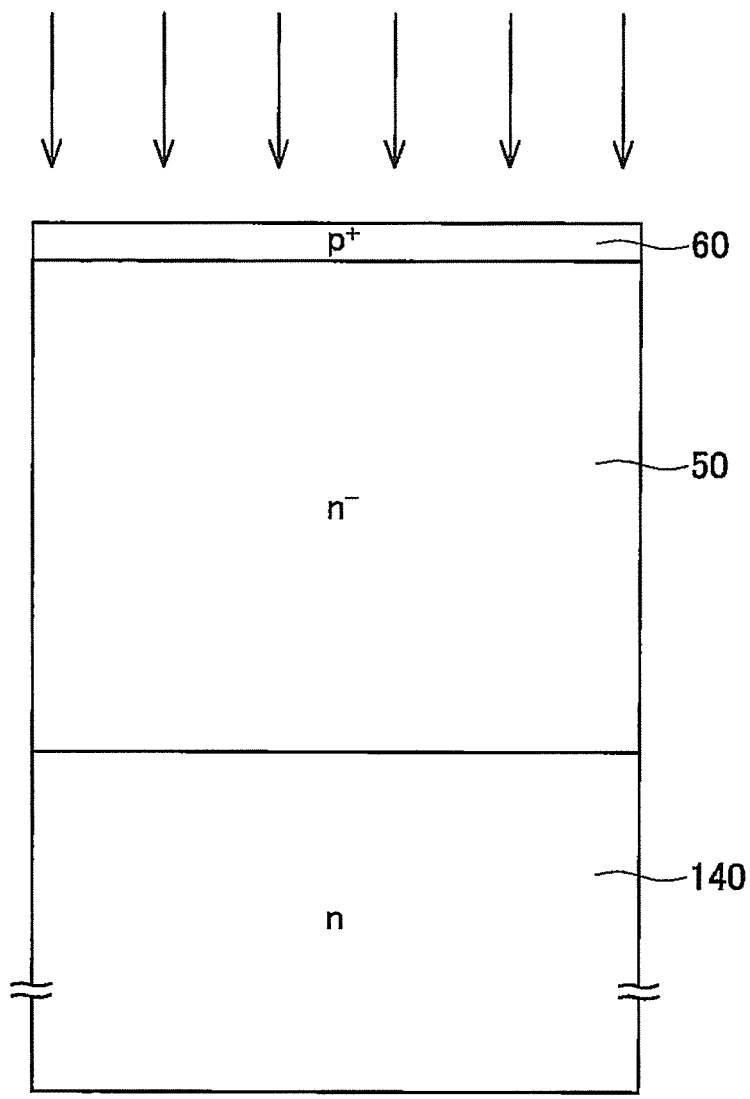
FIG. 8 shows a third step of the manufacturing method of the diode in the embodiment.

Next, as shown in FIG. 8, the silicon oxide film 52 on the element region is removed by using the techniques of the photoresist and the etching. Next, boron is introduced within the surface portion of the epitaxial layer 150 by using the technique of the ion implantation. After the implantation of boron, introduced boron is activated by using the technique of the thermal diffusion so that the anode region 60 is formed. As a result of the ion implantation step and the thermal diffusion step, a left region of the epitaxial layer 150 other than the anode region 60 becomes the voltage maintaining region 50. In one embodiment, the peak density of impurities in the anode region 60 is about $1\times10^{17}$ cm$^{-3}$, and the thickness of the anode region 60 is about 2 μm.

Figure 9:
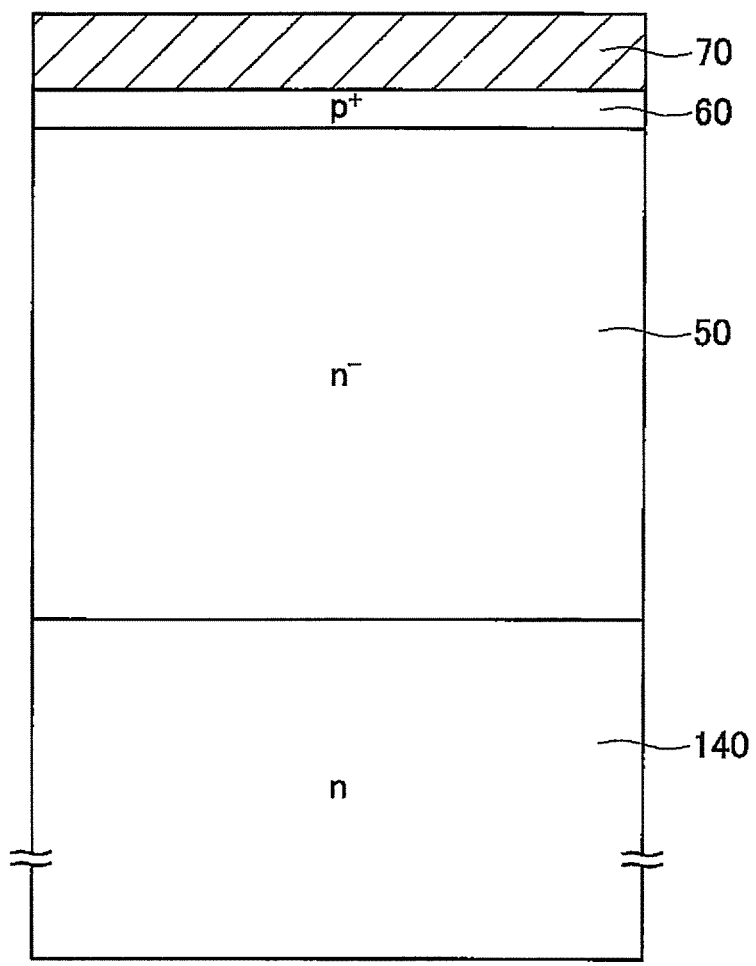
FIG. 9 shows a forth step of the manufacturing method of the diode in the embodiment.

Next, as shown in FIG. 9, the anode electrode 70 is foamed on the anode region 60 by using the techniques of the vapor deposition and the sputtering. In one embodiment, the material of the anode electrode 70 is aluminum.

Figure 10:
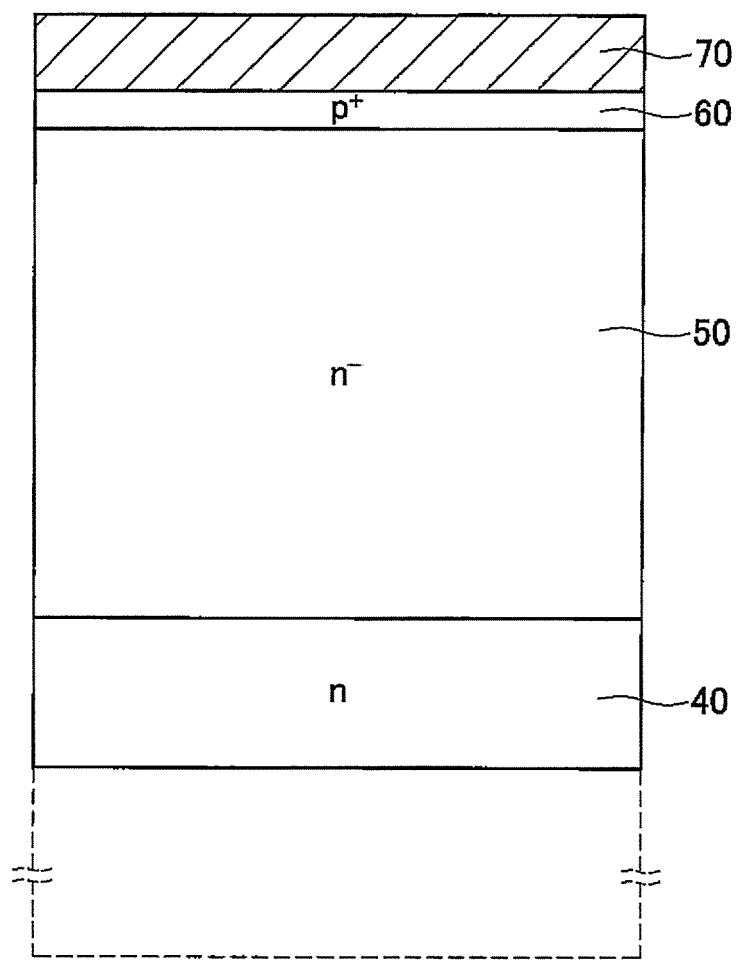
FIG. 10 shows a fifth step of the manufacturing method of the diode in the embodiment.

Next, as shown in FIG. 10, the base substrate 140 is polished to be a predetermined thickness so that the n-type impurity introducing region 40 is formed. In one embodiment, the thickness of the n-type impurity introducing region 40 is about 30 μm.

Figure 11:
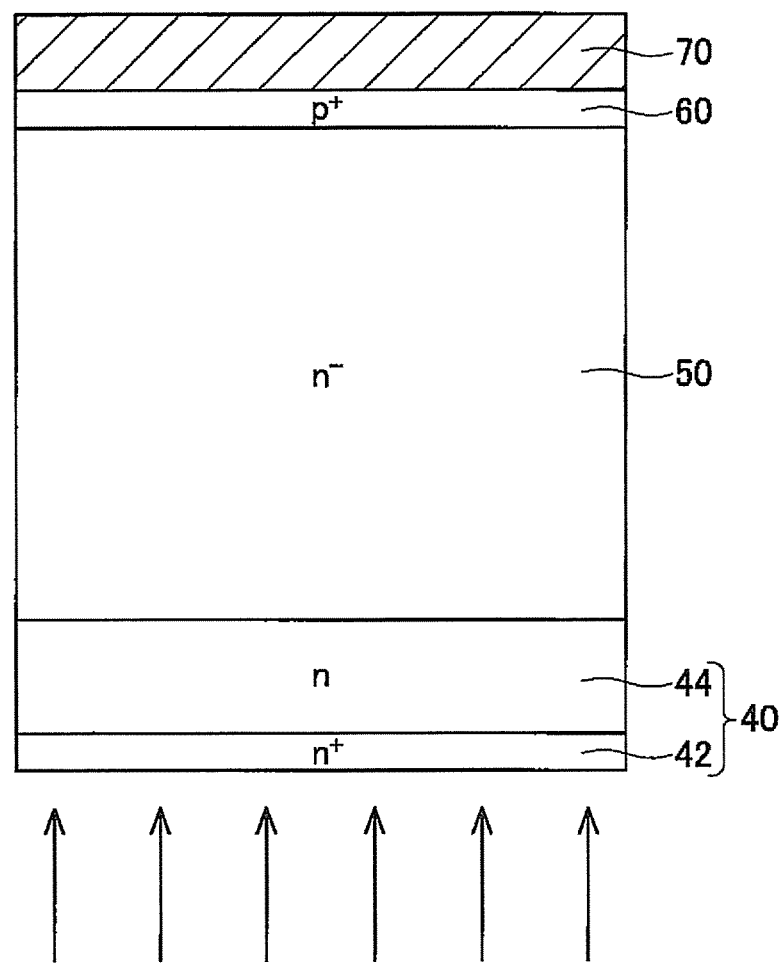
FIG. 11 shows a sixth step of the manufacturing method of the diode in the embodiment.

Next, as shown in FIG. 11, phosphorus is introduced within a bottom portion of the base substrate 140 by using the technique of the ion implantation. After the implantation of phosphorus, phosphorus are activated by using the technique of the laser anneal so that the cathode region 42 is formed. As a result of the ion implantation step and the laser anneal step, a left region of the n-type impurity introducing region 40 other than the cathode region 42 become the electrical field inhibition region 44. In one embodiment, the peak density of impurities in the cathode region 42 is about $1\times10^{20}$ cm$^{-3}$, and the thickness of the cathode region 42 is about 0.2 μm.

Figure 12:
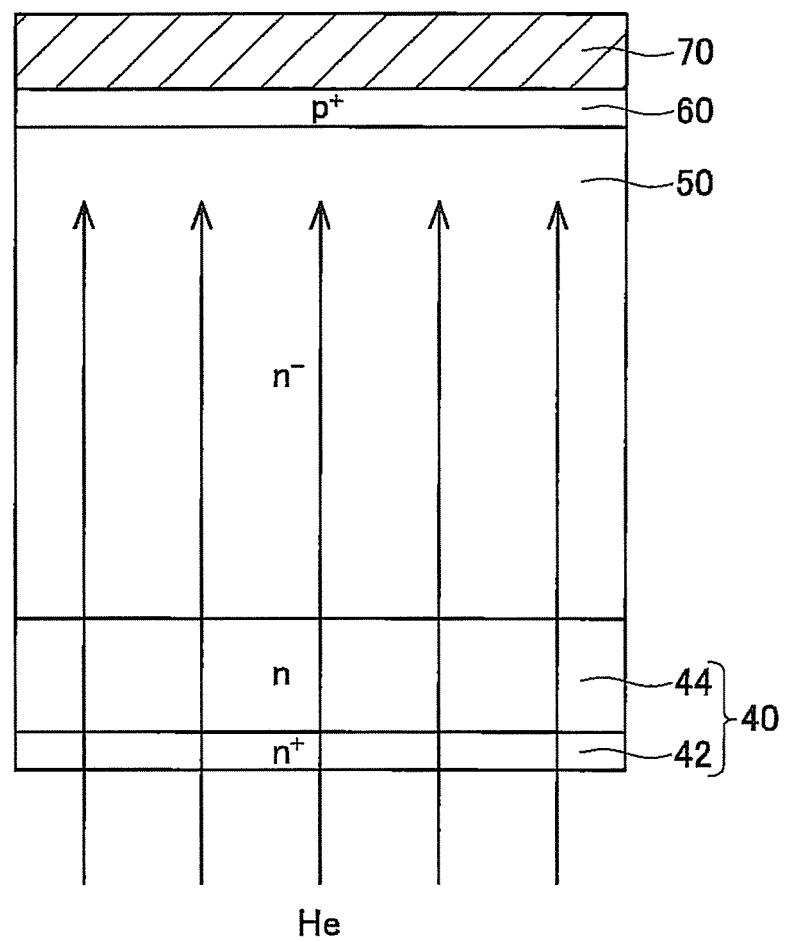
FIG. 12 shows a seventh step of the manufacturing method of the diode in the embodiment.

Next, as shown in FIG. 12, helium of mass "3" is irradiated from the n-type impurity introducing region 40 side by using the technique of the helium irradiation. The range location is set at the voltage maintaining region 50 side adjacent to a pn joint interface between the voltage maintaining region 50 and the anode region 60. The range location is adjusted based on a thickness of undepicted aluminum foil for energy absorption. Next, oxygen-vacancy defects and vacancy cluster defects are formed by performing the postdeposition annealing. Finally, the cathode electrode 30 is formed by using the technique of the vapor deposition and the sputtering. In one embodiment, the material of the cathode electrode 30 is aluminum. The diode 10 shown in FIG. 2 is manufactured through these steps.

Figure 13:
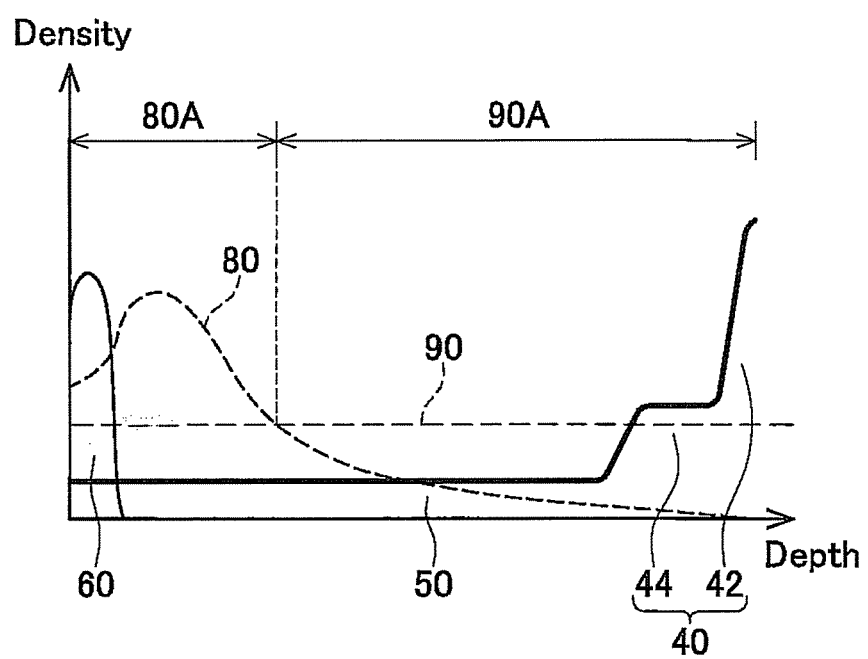
FIG. 13 shows distributions of an impurity density and a crystal defect density of the diode in the embodiment.

The FIG. 13 shows distributions of the impurity density and the crystal defect density. The broken line 80 shows the density of vacancy cluster defects formed by the irradiation of helium. The broken line 90 shows the density of oxygen-vacancy defects formed by combining the introduced oxygen with the vacancy. The diode 10 comprises a first region 90A in which the density of oxygen-vacancy defects 90 is greater than the density of vacancy cluster defects 80, and a second region 80A in which the density of vacancy cluster defects 80 is greater than the density of oxygen-vacancy defects 90. The first region 90A is located at the n-type impurity introducing region 40 and at the part of the voltage maintaining region 50 where is the n-type impurity introducing region 40 side. The second region 80A is located at the anode region 60 and at the part of the voltage maintaining region 50 where is the anode region 60 side. Further, as shown in FIG. 13, the first region 90A is a region where the oxygen-vacancy defects 90 are formed such that the introduced oxygen combines with the vacancy, and also a region where the vacancy cluster defects 80 are formed by the irradiation of helium. Although both of the oxygen-vacancy defects 90 and the vacancy cluster defects 80 are formed, the first region 90A is a region where the density of oxygen-vacancy defects 90 is greater than the density of vacancy cluster defects 80. On the other hand, the second region 80A is a region where the vacancy cluster defects 80 are formed by the irradiation of helium, and also a region where the oxygen-vacancy defects 90 are formed such that the introduced oxygen combines with the vacancy. Although both of the vacancy cluster defects 80 and the oxygen-vacancy defects 90 are formed, the second region 80A is a region where the density of vacancy cluster defects 80 is greater than the density of oxygen-vacancy defects 90.

Figure 1:
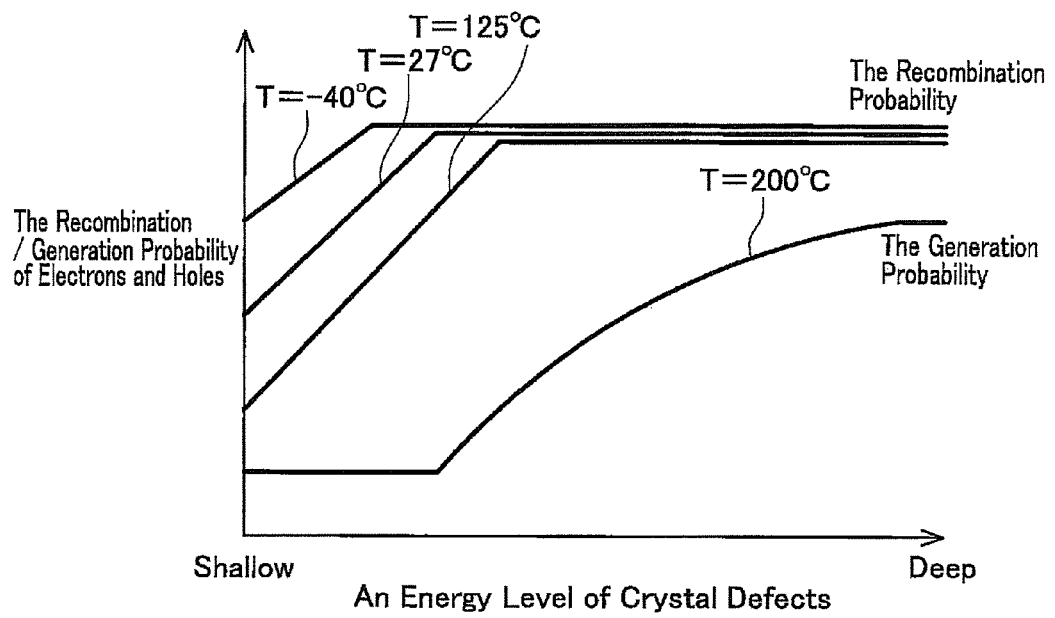
FIG. 1 shows a relationship between an energy level of crystal defects and a recombination probability, and also shows a relationship between the energy level of crystal defects and a generation probability of electrons and holes.

The oxygen-vacancy defects 90 have the energy level at 0.17 eV lower from the conductance band energy edge (Ec), and its energy level belongs to a shallow energy level. Hence, as shown in FIG. 1, the generation probability of electrons and holes in the oxygen-vacancy defects 90 is low. Therefore, even if the oxygen-vacancy defects 90 are formed in huge amount, the leak current can be repressed. In particular, the oxygen-vacancy defects 90 are formed all over the semiconductor substrate 20 in the diode 10. As a result, the reverse recovery charge (Qrr) is drastically repressed while the leak current is repressed. However, the recombination probability of electrons and holes in the oxygen-vacancy defects 90 vary based on the temperature. In the diode 10, the vacancy cluster defects 80 formed by the irradiation of helium are formed at the pn joint interface between the voltage maintaining region 50 and the anode region 60. The vacancy cluster defects 80 have the energy level that is lower by 0.40 eV from the conductance band energy edge (Ec), and its energy level belongs to a deep energy level. Hence, the recombination probability of vacancy cluster defects 80 is characterized in that it does not vary based on the temperature. In the diode 10, the vacancy cluster defects 80 can compensate a temperature dependence of the recombination probability of electrons and holes in the oxygen-vacancy defects 90. Further, in the diode 10, since the peak value of the vacancy cluster defects 80 is formed at the pn joint interface between the voltage maintaining region 50 and the anode region 60, the recovery current can be softened. As mentioned above, in the diode 10, the oxygen-vacancy defects 90 as the shallow energy level and the vacancy cluster defects 80 as the deep energy level are mixed so that the lowering of the reverse recovery charge (Qrr) and softening of the recovery current are realized while the increasing of the leak current is repressed.

Figure 14:
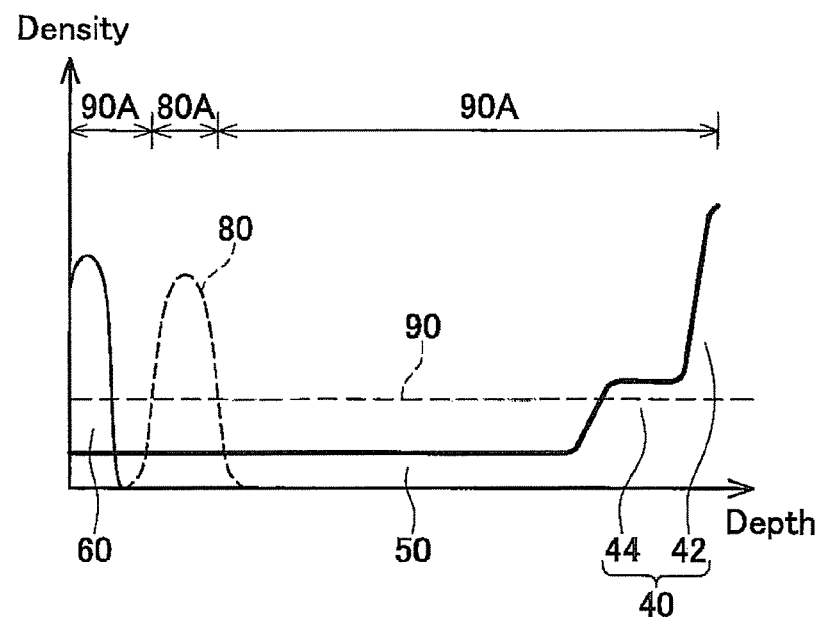
FIG. 14 shows distributions of an impurity density and a crystal defect density of the diode in one modified embodiment.

FIG. 14 shows distributions of the impurity density and the crystal defect density in one modified embodiment. In the diode of the modified embodiment, it is characterized in that the vacancy cluster defects 80 formed by the irradiation of helium are formed in a narrow range. In particular, the vacancy cluster defects 80 are not formed at the pn joint interface between the voltage maintaining region 50 and the anode region 60, but are formed within the voltage maintaining region 50. In one embodiment, this modified diode can be formed such that the helium of mass "4" are irradiated from the cathode region 42 side. In this modified diode, the vacancy cluster defects 80 are not formed at the pn joint interface between the voltage maintaining region 50 and the anode region 60 where the electrical field is, in general, the highest in the reverse biased state. Therefore, in this modified diode, the leak current is drastically repressed. Further, the recombination of electrons and holes occurs at a more localized area, and the softening of the recovery current is further improved.

Figure 15:
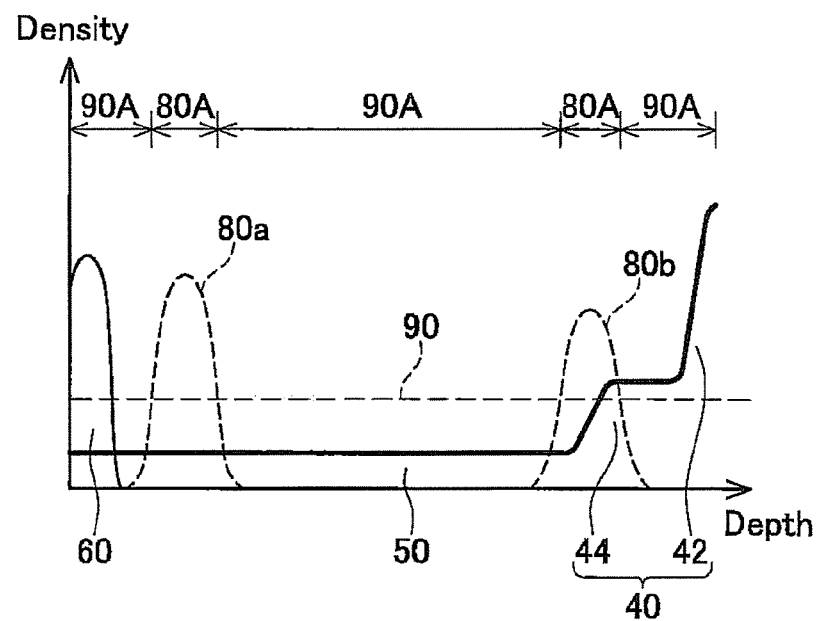
FIG. 15 shows distributions of an impurity density and a crystal defect density of the diode in another modified embodiment.

FIG. 15 shows distributions of the impurity density and the crystal defect density in another modified embodiment. In the diode of the modified embodiment, it is characterized in that the vacancy cluster defects 80 formed by the irradiation of helium are formed in a narrow range such that a first group of the vacancy cluster defects 80a is formed at the anode region 60 side, and a second group of the vacancy cluster defects 80b is formed at the electrical field inhibition region 44 side. In this modified diode, since the second group of vacancy cluster defects 80b is formed at a joint interface between the electrical field inhibition region 44 and the voltage maintaining region 50, the recovering time of the recovery current (specifically, that of its tail current) can be shortened. Further, since the vacancy cluster defects 80b have the deep energy level, the shortening effect of the recovering time of recovery current can be maintained even in the high temperature.

Representative, non-limiting examples of the present invention have been described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved semiconductor devices, as well as methods for manufacturing the same.

Moreover, combinations of features and steps disclosed in the following detail description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

In one aspect of the present teachings, a semiconductor device may comprise a semiconductor substrate, a first electrode formed on a first main surface of the semiconductor substrate, and a second electrode formed on a second main surface of the semiconductor substrate. The semiconductor substrate may includes a first region in which a density of oxygen-vacancy defects is more than a density of vacancy cluster defects, and a second region in which the density of vacancy cluster defects is greater than the density of oxygen-vacancy defects.

In one aspect of the present teachings, the density of oxygen-vacancy defects may not have a peak in the semiconductor substrate. The term of "the peak" herein means that there is no local maximal value within the semiconductor substrate along the thickness direction. Therefore, in the case where the density of oxygen-vacancy defects monotonically increase or decrease along the thickness direction, it can be read that there is no local maximal value. More preferably, the density of oxygen-vacancy defects may be constant within the semiconductor substrate between the first main surface and the second main surface. In these configurations, the increase of leak current is repressed and the reverse recovery charge (Qrr) is drastically lowered.

In one aspect of the present teachings, the density of oxygen-vacancy defects in the first region is greater than $1 \times 10^{13}$ cm$^{-3}$. The oxygen-vacancy defects having such a high density range can be evaluated as being purposely formed.

In one aspect of the present teachings, the semiconductor device may be a diode, as mentioned in the above embodiments. In this case, the first electrode may be a cathode electrode, and the second electrode may be an anode electrode. It should be noted that, alternatively, the present teachings is not limited to an embodiment of the diode. For example, IGBT or MOSFET may be realized by the present teaching.

In one aspect of the present teachings, the diode may be a vertical PIN diode which comprises a n$^+$-type cathode region, n-type electrical field inhibition region, n$^-$-type voltage maintaining region and p$^+$-type anode region.

In one aspect of the present teachings, the first region in which the density of oxygen-vacancy defects is greater than the density of vacancy cluster defects may be located within the voltage maintaining region.

In one aspect of the present teachings, the density of oxygen-vacancy defects may be at least greater than $1 \times 10^{13}$ cm$^{-3}$. The oxygen-vacancy defects having such a density are evaluated as purposely-formed by introducing oxygen.

In one aspect of the present teachings, the second region in which the density of vacancy cluster defects is greater than the density of oxygen-vacancy defects may be located at a pn joint interface between the voltage maintaining region and the anode region. Further, it is preferable that the peak value of the second region is located at the voltage maintaining region side adjacent to the pn joint interface between the voltage maintaining region and the anode region. It is more preferable that the second region is not located within the anode region. In this configuration, additional second region in which the density of vacancy cluster defects is greater than the density of oxygen-vacancy defects may be located at a joint interface between an electrical field inhibition region and the voltage maintaining region.

In one aspect of the present teachings, the energy level of the recombination center for oxygen-vacancy defects may be an electron trap level between 0.15 eV to 0.25 eV lower from the conductance band energy edge (Ec).

In one aspect of the present teachings, the energy level of the recombination center for vacancy cluster defects may be an electron trap level between 0.35 eV to 0.55 eV lower from the conductance band energy edge (Ec).

In one aspect of the present teachings, a manufacturing method of a semiconductor device may be provided. The semiconductor device comprises a semiconductor substrate including a first region and a second region, wherein a density of oxygen-vacancy defects is greater than a density of vacancy cluster defects in the first region, and the density of vacancy cluster defects is greater than the density of oxygen-vacancy defects in the second region. The manufacturing method may comprise introducing oxygen into the semiconductor substrate, and irradiating charged particles to a predetermined depth in the semiconductor substrate. The high density region of oxygen-vacancy defects is formed within the semiconductor substrate by performing the step of introducing oxygen. Further, charged particles are irradiated at predetermined depth in the step of irradiating charged particles. As a result, the first region in which the density of oxygen-vacancy defects is greater than the density of vacancy cluster defects and the second region in which the density of vacancy cluster defects is greater than the density of oxygen-vacancy defects are formed within the semiconductor substrate.

The step of introducing oxygen may comprise forming an oxide film on an one of main surface of the semiconductor substrate and annealing the semiconductor substrate in a state that the oxide film is present. The oxygen can be introduced within the semiconductor substrate by using the simple process.

In the step of forming the oxide film, an oxidation temperature may be set between 1100-1200 degrees Celsius, and an oxidation time may be set between 10-500 minutes. In the step of annealing the semiconductor substrate, annealing temperature may be set higher than 1150 degrees Celsius. As a result, a high density of oxygen can be introduced within the semiconductor substrate.

In the step of introducing oxygen, an oxygen density within the semiconductor substrate may rise at an entire area along a thickness direction. As a result, the high density region of oxygen-vacancy defects is surely formed within the semiconductor substrate.

What is claimed is:

1. A manufacturing method of a semiconductor device comprising a semiconductor substrate including a first region and a second region,
wherein a density of oxygen-vacancy defects is greater than a density of vacancy cluster defects in the first region, and the density of vacancy cluster defects is greater than the density of oxygen-vacancy defects in the second region, the method comprising:
introducing oxygen into the semiconductor substrate; and
irradiating charged particles to a predetermined depth in the semiconductor substrate, and
wherein said introducing oxygen into the semiconductor substrate further comprising:
forming an oxide film on one of main surfaces of the semiconductor substrate;

and annealing the semiconductor substrate in a state that the oxide film is present.

2. The manufacturing method according to claim 1, wherein in said forming the oxide film, an oxidation temperature is set between 1100-1200 degrees Celsius, and an oxidation time is set between 10-500 minutes, and in said annealing the semiconductor substrate, an annealing temperature is set higher than 1150 degrees Celsius.

3. The manufacturing method according to claim 1, wherein in said introducing oxygen, an oxygen density within the semiconductor substrate rises at an entire area along a thickness direction.

* * * * *

UNITED STATES PATENT AND TRADEMARK OFFICE
CERTIFICATE OF CORRECTION

PATENT NO.      : 8,846,544 B2                     Page 1 of 1
APPLICATION NO. : 14/193434
DATED           : September 30, 2014
INVENTOR(S)     : Tadashi Misumi et al.

It is certified that error appears in the above-identified patent and that said Letters Patent is hereby corrected as shown below:

In the Specification

At column 4, line 31, change "$1 \times 10^{14}$ cm$^3$" to -- $1 \times 10^{14}$ cm$^{-3}$ --.

At column 6, line 48, change "70 is foamed" to -- 70 is formed --.

Signed and Sealed this
Twenty-third Day of June, 2015

Michelle K. Lee
*Director of the United States Patent and Trademark Office*